US010269842B2

United States Patent
Muramatsu et al.

(10) Patent No.: US 10,269,842 B2
(45) Date of Patent: Apr. 23, 2019

(54) ANTI-REFLECTION LAYER FOR BACK-ILLUMINATED SENSOR

(71) Applicants: KLA-Tencor Corporation, Milpitas, CA (US); Hamamatsu Photonics K.K., Hamamatsu-shi, Shizuoka (JP)

(72) Inventors: Masaharu Muramatsu, Hamamatsu (JP); Hisanori Suzuki, Hamamatsu (JP); Yasuhito Yoneta, Hamamatsu (JP); Shinya Otsuka, Hamamatsu (JP); Jehn-Huar Chern, San Jose, CA (US); David L. Brown, Los Gatos, CA (US); Yung-Ho Alex Chuang, Cupertino, CA (US); John Fielden, Los Altos, CA (US); Venkatraman Iyer, Saratoga, CA (US)

(73) Assignees: Hamamatsu Photonics K.K., Shizuoka (JP); KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 15/668,776

(22) Filed: Aug. 4, 2017

(65) Prior Publication Data
US 2017/0338257 A1   Nov. 23, 2017

Related U.S. Application Data

(62) Division of application No. 14/591,325, filed on Jan. 7, 2015, now Pat. No. 9,748,294.
(Continued)

(51) Int. Cl.
*H01L 27/146* (2006.01)
(52) U.S. Cl.
CPC ...... *H01L 27/1462* (2013.01); *H01L 27/1464* (2013.01); *H01L 27/14685* (2013.01); *H01L 27/14687* (2013.01)

(58) Field of Classification Search
CPC . H01L 21/0276; H01L 21/3242; H01L 21/56; H01L 21/64
See application file for complete search history.

(56) References Cited

U.S. PATENT DOCUMENTS 3,870,917 A   3/1975  Cuny
3,947,707 A   3/1976  Shannon et al.
(Continued)

FOREIGN PATENT DOCUMENTS

EP   0602983 A1   6/1994
EP   0746871 A1   12/1996
EP   1939917 A2   7/2008
EP   2346094 A1   7/2011
(Continued)

OTHER PUBLICATIONS

U.S. Appl. No. 61/720700—Certified Copy comes to PCT/EP2013/071080, pp. 1-44.
(Continued)

*Primary Examiner* — Cuong Q Nguyen
(74) *Attorney, Agent, or Firm* — Bever, Hoffman & Harms, LLP

(57) ABSTRACT

An image sensor for short-wavelength light includes a semiconductor membrane, circuit elements formed on one surface of the semiconductor membrane, and a pure boron layer on the other surface of the semiconductor membrane. An anti-reflection or protective layer is formed on top of the pure boron layer. This image sensor has high efficiency and good stability even under continuous use at high flux for multiple years. The image sensor may be fabricated using CCD (charge coupled device) or CMOS (complementary metal oxide semiconductor) technology. The image sensor may be a two-dimensional area sensor, or a one-dimensional array sensor.

9 Claims, 8 Drawing Sheets

Related U.S. Application Data

(60) Provisional application No. 61/926,107, filed on Jan. 10, 2014.

(56) References Cited

U.S. PATENT DOCUMENTS

| | | |
|---|---|---|
| 4,099,198 A | 7/1978 | Howorth et al. |
| 4,210,922 A | 7/1980 | Shannon |
| 4,275,326 A | 6/1981 | Houtkamp |
| 4,348,690 A | 9/1982 | Jastrzebski et al. |
| 4,467,189 A | 8/1984 | Tsuchiya |
| 4,555,731 A | 11/1985 | Zinchuk |
| 4,644,221 A | 2/1987 | Gutierrez et al. |
| 4,760,031 A | 7/1988 | Janesick |
| 4,853,595 A | 8/1989 | Alfano et al. |
| 5,054,683 A | 10/1991 | Haisma et al. |
| 5,120,949 A | 6/1992 | Tomasetti |
| 5,227,313 A | 7/1993 | Gluck et al. |
| 5,315,126 A | 5/1994 | Field |
| 5,376,810 A | 12/1994 | Hoenk et al. |
| 5,428,392 A | 6/1995 | Castro et al. |
| 5,483,378 A | 1/1996 | Rahn |
| 5,563,702 A | 10/1996 | Emery et al. |
| 5,717,518 A | 2/1998 | Shafer et al. |
| 5,719,069 A | 2/1998 | Sparks |
| 5,731,584 A | 3/1998 | Beyne et al. |
| 5,760,809 A | 6/1998 | Malhotra et al. |
| 5,760,899 A | 6/1998 | Eismann |
| 5,852,322 A | 12/1998 | Speckbacher |
| 5,940,685 A | 8/1999 | Loomis et al. |
| 5,999,310 A | 12/1999 | Shafer et al. |
| 6,013,399 A | 1/2000 | Nguyen |
| 6,030,852 A | 2/2000 | Sano et al. |
| 6,064,759 A | 5/2000 | Buckley et al. |
| 6,162,707 A | 12/2000 | Dinh et al. |
| 6,201,601 B1 | 3/2001 | Vaez-Iravani et al. |
| 6,271,916 B1 | 8/2001 | Marxer et al. |
| 6,278,119 B1 | 8/2001 | Nikzad et al. |
| 6,285,018 B1 | 9/2001 | Aebi et al. |
| 6,297,879 B1 | 10/2001 | Yang et al. |
| 6,307,586 B1 | 10/2001 | Costello |
| 6,346,700 B1 | 2/2002 | Cunningham et al. |
| 6,362,484 B1 | 3/2002 | Beyne et al. |
| 6,373,869 B1 | 4/2002 | Jacob |
| 6,403,963 B1 | 6/2002 | Nikzad et al. |
| 6,535,531 B1 | 3/2003 | Smith et al. |
| 6,545,281 B1 | 4/2003 | McGregor et al. |
| 6,608,676 B1 | 8/2003 | Zhao et al. |
| 6,837,766 B2 | 1/2005 | Costello |
| 7,005,637 B2 | 2/2006 | Costello et al. |
| 7,039,157 B2 | 5/2006 | Fujii et al. |
| 7,130,039 B2 | 10/2006 | Vaez-Iravani et al. |
| 7,136,159 B2 | 11/2006 | Tsai et al. |
| 7,141,791 B2 | 11/2006 | Masnaghetti et al. |
| 7,283,166 B1 | 10/2007 | Billman |
| 7,313,155 B1 | 12/2007 | Mu et al. |
| 7,321,468 B2 | 1/2008 | Herkommer et al. |
| 7,345,825 B2 | 3/2008 | Chuang et al. |
| 7,352,457 B2 | 4/2008 | Kvamme et al. |
| 7,432,517 B2 | 10/2008 | Botma et al. |
| 7,446,474 B2 | 11/2008 | Maldonado et al. |
| 7,465,935 B2 | 12/2008 | Urano et al. |
| 7,471,315 B2 | 12/2008 | Silsby et al. |
| 7,525,649 B1 | 4/2009 | Leong et al. |
| 7,528,943 B2 | 5/2009 | Brown et al. |
| 7,586,108 B2 | 9/2009 | Nihtianov et al. |
| 7,609,303 B1 | 10/2009 | Lee et al. |
| 7,609,309 B2 | 10/2009 | Brown et al. |
| 7,714,287 B1 | 5/2010 | James et al. |
| 7,741,666 B2 | 6/2010 | Nozaki et al. |
| 7,750,280 B2 | 7/2010 | Hwang et al. |
| 7,791,170 B2 | 9/2010 | Chiang et al. |
| 7,800,040 B2 | 9/2010 | Blacksberg et al. |
| 7,813,406 B1 | 10/2010 | Nguyen et al. |
| 7,838,833 B1 | 11/2010 | Lent et al. |
| 7,875,948 B2 | 1/2011 | Hynecek et al. |
| 7,928,382 B2 | 4/2011 | Hatakeyama et al. |
| 7,952,633 B2 | 5/2011 | Brown et al. |
| 7,985,658 B2 | 7/2011 | Lei et al. |
| 7,999,342 B2 | 8/2011 | Hsu et al. |
| 8,017,427 B2 | 9/2011 | Manabe |
| 8,138,485 B2 | 3/2012 | Nihtianov et al. |
| 8,309,443 B2 | 11/2012 | Tanaka et al. |
| 8,323,406 B2 | 12/2012 | Bondokov et al. |
| 8,450,820 B2 | 5/2013 | Nanver et al. |
| 8,455,971 B2 | 6/2013 | Chen et al. |
| 8,513,587 B2 | 8/2013 | Wang et al. |
| 8,514,587 B2 | 8/2013 | Zhang et al. |
| 8,629,384 B1 | 1/2014 | Biellak et al. |
| 8,686,331 B2 | 4/2014 | Armstrong |
| 9,123,622 B2 | 9/2015 | Hoenk et al. |
| 9,165,971 B2 | 10/2015 | Greer et al. |
| 9,426,400 B2 | 8/2016 | Brown et al. |
| 9,478,402 B2 | 10/2016 | Chuang et al. |
| 9,496,425 B2 * | 11/2016 | Chern ................. H01L 31/0216 |
| 2001/0017344 A1 | 8/2001 | Aebi |
| 2001/0024684 A1 | 9/2001 | Steiner et al. |
| 2002/0191834 A1 | 12/2002 | Fishbaine |
| 2003/0111707 A1 | 6/2003 | Takaura et al. |
| 2003/0222579 A1 | 12/2003 | Habib et al. |
| 2004/0021061 A1 | 2/2004 | Bijkerk |
| 2004/0056279 A1 | 3/2004 | Niigaki et al. |
| 2004/0074261 A1 | 4/2004 | Caron et al. |
| 2004/0227070 A1 | 11/2004 | Bateman et al. |
| 2005/0122021 A1 | 6/2005 | Smith et al. |
| 2005/0167575 A1 | 8/2005 | Benz et al. |
| 2005/0196059 A1 | 9/2005 | Inoue et al. |
| 2005/0233493 A1 | 10/2005 | Augusto et al. |
| 2005/0255625 A1 | 11/2005 | Janesick et al. |
| 2005/0264148 A1 | 12/2005 | Maldonado et al. |
| 2005/0287479 A1 | 12/2005 | Moon et al. |
| 2006/0054778 A1 | 3/2006 | Suhling |
| 2006/0055321 A1 | 3/2006 | Maldonado et al. |
| 2006/0069460 A1 | 3/2006 | Smith et al. |
| 2006/0170324 A1 | 8/2006 | Machuca et al. |
| 2006/0188869 A1 | 8/2006 | Zeskind et al. |
| 2007/0002465 A1 | 1/2007 | Chuang et al. |
| 2007/0023770 A1 | 2/2007 | Miyajima et al. |
| 2007/0034987 A1 | 2/2007 | Costello et al. |
| 2007/0064135 A1 | 3/2007 | Brown et al. |
| 2007/0072326 A1 | 3/2007 | Zheng et al. |
| 2007/0096648 A1 | 5/2007 | Nakajima et al. |
| 2007/0103769 A1 | 5/2007 | Kuwabara |
| 2007/0138378 A1 | 6/2007 | Chang et al. |
| 2007/0177289 A1 | 8/2007 | Shim et al. |
| 2007/0188744 A1 | 8/2007 | Leslie et al. |
| 2007/0210395 A1 | 9/2007 | Maruyama et al. |
| 2007/0291810 A1 | 12/2007 | Luo et al. |
| 2008/0044932 A1 | 2/2008 | Samoilov et al. |
| 2008/0173903 A1 | 7/2008 | Imai et al. |
| 2008/0267241 A1 | 10/2008 | Brown et al. |
| 2008/0315092 A1 | 12/2008 | Kley |
| 2008/0315121 A1 | 12/2008 | Nihtianov et al. |
| 2009/0021717 A1 | 1/2009 | Nihtianov et al. |
| 2009/0045325 A1 | 2/2009 | Tomuta et al. |
| 2009/0091752 A1 | 4/2009 | Terasawa et al. |
| 2009/0108207 A1 | 4/2009 | Liu |
| 2009/0125242 A1 | 5/2009 | Choi et al. |
| 2009/0128912 A1 | 5/2009 | Okada et al. |
| 2009/0168152 A1 | 7/2009 | Gelernt et al. |
| 2009/0180176 A1 | 7/2009 | Armstrong et al. |
| 2010/0026865 A1 | 2/2010 | Tivarus et al. |
| 2010/0038540 A1 | 2/2010 | Hannebauer |
| 2010/0102213 A1 | 4/2010 | Garris |
| 2010/0103409 A1 | 4/2010 | Ohshima et al. |
| 2010/0140675 A1 | 6/2010 | Rhodes |
| 2010/0148667 A1 | 6/2010 | Niigaki et al. |
| 2010/0164042 A1 | 7/2010 | Manabe |
| 2010/0188655 A1 | 7/2010 | Brown et al. |
| 2010/0208979 A1 | 8/2010 | Abbott et al. |
| 2010/0233869 A1 | 9/2010 | Park et al. |
| 2010/0301437 A1 | 12/2010 | Brown |
| 2011/0062499 A1 | 3/2011 | Burke |
| 2011/0073982 A1 | 3/2011 | Armstrong et al. |
| 2011/0101219 A1 | 5/2011 | Uchiyama et al. |

(56) References Cited

U.S. PATENT DOCUMENTS

| | | |
|---|---|---|
| 2011/0116077 A1 | 5/2011 | Chuang et al. |
| 2011/0168886 A1 | 7/2011 | Shadman et al. |
| 2011/0169116 A1 | 7/2011 | Nanver et al. |
| 2011/0234790 A1 | 9/2011 | True |
| 2011/0256655 A1 | 10/2011 | Nikzad et al. |
| 2011/0261354 A1 | 10/2011 | Sinfield et al. |
| 2011/0291109 A1 | 12/2011 | Wraback et al. |
| 2012/0007920 A1 | 1/2012 | Takahashi |
| 2012/0012811 A1 | 1/2012 | Deflumere et al. |
| 2012/0012957 A1 | 1/2012 | Larsen et al. |
| 2012/0081684 A1 | 4/2012 | Den et al. |
| 2012/0132823 A1 | 5/2012 | Menge et al. |
| 2012/0160993 A1 | 6/2012 | Nevet et al. |
| 2012/0170021 A1 | 7/2012 | Walsh |
| 2012/0217558 A1* | 8/2012 | Togashi ............ H01L 27/14614 257/292 |
| 2012/0228485 A1 | 9/2012 | Iwakiri et al. |
| 2012/0268722 A1 | 10/2012 | Nihtianov et al. |
| 2013/0009069 A1 | 1/2013 | Okada |
| 2013/0016346 A1 | 1/2013 | Romanovsky et al. |
| 2013/0017205 A1 | 1/2013 | Giaccia et al. |
| 2013/0020491 A1 | 1/2013 | Mazzillo |
| 2013/0056843 A1 | 3/2013 | Lee et al. |
| 2013/0082241 A1 | 4/2013 | Kub et al. |
| 2013/0126705 A1 | 5/2013 | Maleev |
| 2013/0148112 A1 | 6/2013 | Chuang et al. |
| 2013/0149807 A1 | 6/2013 | Jangjian et al. |
| 2013/0169957 A1 | 7/2013 | Wolf et al. |
| 2013/0176552 A1 | 7/2013 | Brown et al. |
| 2013/0194445 A1 | 8/2013 | Brown et al. |
| 2013/0270663 A1* | 10/2013 | Lin ................... H01L 27/14625 257/432 |
| 2013/0313440 A1 | 11/2013 | Chuang et al. |
| 2013/0320211 A1 | 12/2013 | Park et al. |
| 2013/0336574 A1 | 12/2013 | Nasser-Ghodsi et al. |
| 2013/0341504 A1 | 12/2013 | Neill et al. |
| 2014/0034816 A1 | 2/2014 | Chuang et al. |
| 2014/0111799 A1 | 4/2014 | Lei et al. |
| 2014/0151552 A1 | 6/2014 | Jiang et al. |
| 2014/0203386 A1 | 7/2014 | Bui et al. |
| 2014/0204963 A1 | 7/2014 | Chuang et al. |
| 2014/0246595 A1 | 9/2014 | Menge et al. |
| 2014/0362203 A1 | 12/2014 | Delaney et al. |
| 2015/0177159 A1 | 6/2015 | Brown et al. |
| 2015/0275393 A1 | 10/2015 | Bondokov et al. |
| 2015/0294998 A1 | 10/2015 | Nihtianov et al. |

FOREIGN PATENT DOCUMENTS

| | | |
|---|---|---|
| JP | H0511287 A | 1/1993 |
| JP | H08241977 A | 9/1996 |
| JP | H10171965 A | 6/1998 |
| JP | 2002033473 | 1/2002 |
| JP | 2003043533 A | 2/2003 |
| JP | 2004031452 A | 1/2004 |
| JP | 2007249092 A | 9/2007 |
| JP | 2007298932 A | 11/2007 |
| JP | 2009117454 A | 5/2009 |
| JP | 2011216623 A | 10/2011 |
| KR | 100688497 B1 | 3/2007 |
| KR | 100826407 B1 | 5/2008 |
| RU | 2297070 C2 | 4/2007 |
| WO | 9532518 A1 | 11/1995 |
| WO | 9617372 A1 | 6/1996 |
| WO | 2007035858 A2 | 3/2007 |
| WO | 2011091159 A1 | 7/2011 |
| WO | 2014067754 A2 | 5/2014 |

OTHER PUBLICATIONS

Allen et al., Work Function, Photoelectric Threshold, and Surface . . . ; Physical Review, vol. 127, No. 1, Jul. 1, 1962, pp. 150-158.

Dulinski et al., Tests of a backside illuminated monolithic CMOS pixel . . . , Nuclear Instruments and Methods in Physics Research A 546 (2005) 274-280, 7 pgs.

Fu et al., Optimizing GaN photocathode structure for higher . . . ; Optik, vol. 123, No. 9, May 2012, pp. 756-768.

Grubisic et al., New Silicon Reach-Through Avalanche Photodiodes with Enhanced Sensitivity in the DUV/UV Wavelength Range, MIPRO 2013, May 20-24, 2013, pp. 48-54.

Hecht, Optics, Fourth Edition, India: Pearson Education Pte, Ltd. 2004.

Hecht, Optics, Second Edition, Adelphi University, 1987, Addison-Wesley Publishing Company, Inc., 3 pages.

Henderson, Brian S., Study of Negative Electron Affinity . . . , Dept. of Physics, Rice Univ., Aug. 7, 2009, 18 pgs.

Howorth et al., Transmission silicon photoemitters . . . , Jrnl of Physics D: Applied Physics, vol. 9, No. 5, Apr. 1, 1976, pp. 785-794.

Huang et al., Back-Side Illuminated Photogate CMOS . . . , IEEE Sensors Journal, vol. 11, No. 9, Sep. 2011, 5 pgs.

ISR and Written Opinion dated Mar. 31, 2014 for PCT/US2013/074124.

Itzler et al., InP-based Geiger-mode . . . , Proc. SPIE vol. 7320 (2000), 12 pgs.

Janesick, James R., Scientific Charge-Coupled Devices, SPIE Press, 2001, pp. 556-561.

Lim, Seunghuyn, Low-Power Analog-to-Digital Converters for . . . ; Graduate School, Yonsei Univ. Dept. of EEE, Feb. 2010, pp. 16-21.

Martinelli, Ramon U., Infrared Photoemission from Silicon, Applied Physics Letters, vol. 16, No. 7, Apr. 1, 1970, pp. 261-262.

Martinelli, Ramon U., Reflection and Transmission Secondary Emission . . . , Applied Physics Letters, vol. 17, No. 8, Oct. 15, 1970, pp. 313-314.

Mouchart et al., Thin Film Optical Coatings. 7: Two Layer Coatings Close to Antireflection, Applied Optics, vol. 18, No. 8, Apr. 15, 1979, pp. 1226-1232.

Nanver et al., Pure-Boron Chemical-Vapor-Deposited Layers: a New Material for Silicon Device Processing, 18th IEEE International Conference on Advanced Thermal Processing of Semiconductors (RTP), Sep. 28, 2010-Oct. 1, 2010, pp. 136-139.

Nanver, Lis K., Silicon Photodiodes for Low Penetration Depth Beams such as DUV/VUV/EUV Light and Low-Energy Electrons, Delta Institute of Microsystems and Nanoelectornics (DIMES), (2011) 21 pgs.

Niclass et al., Design and Characterization of a CMOS 3-D . . . , IEEE Journal Solid-State Circuits, vol. 40, No. 9, Sep. 2005, 8 pgs.

Nikzad, Shouleh et al., Delta-doped CCDs High QE with long-term stability . . . ; SPIE vol. 2198 (1994) pp. 907-915.

Omatsu et al., High repetition rate Q-switching performance . . . , Optics Express vol. 14, Issue 7, pp. 2727-2734, Apr. 3, 2006.

Paetzel et al., Activation of Silicon Wafer by Excimer Laser, 18th IEEE Conf. Advanced Thermal Processing of Semiconductors—RTP 2010, 5 pgs.

Pain; et al., "Pain et al., "A Back-Illuminated Megapixel CMOS Image Sensor", Jun. 9, 2005, IEEE Workshop on Charge-Coupled Devices and Advanced Image Sensors, Karuizawa, Japan, 4 pgs."

Sakic, Agata, Boron-layer silicon photodiodes for high-efficiency low-energy electron detection, Solid-State Electronics 65-66 (2011), pp. 38-44.

Sarubbi et al., Chemical Vapor Deposition of α-Boron Layers on Silicon for Controlled Nanometer-Deep p+ n Junction Formation, J. Electron. Mat., vol. 39, No. 2, Feb. 2010, pp. 162-173.

Sarubbi et al., Pure boron-doped photodiodes . . . IEEE, Sep. 15, 2008, pp. 278-281.

Sobieski, Stanley, Intensified Charge Coupled Devices for Ultra Low Light Level Imaging, NASA, Goddard Space Flight Center, SPIE vol. 78 (1976) Low Light Level Devices, pp. 73-77.

Stevanovic et al., A CMOS Image Sensor for High-Speed Imaging, 2000 IEEE int'l. Solid-State Circuits Conf., 3 pgs.

Tobin, Kenneth W., Inspection in Semiconductor Manufacturing, Webster's Encyclopedia of Electrical and Electronic Engineering, vol. 10, pp. 242-262, Wiley & Sons, NY, NY, 1999.

Vaillant, Joel et al., Int'l. Conf. on Space Optics, High performance UV antirelection coating for back thinned CCD and CMOS Image sensors, Oct. 4-8, 2010, 4 pgs.

(56) References Cited

OTHER PUBLICATIONS

Xiaogian, Fu, Higher Quantum Efficiency by Optimizing . . . 978-1-4244-6644-3/10 IEEE, pp. 234-235.

\* cited by examiner

ANTI-REFLECTION LAYER FOR BACK-ILLUMINATED SENSOR

RELATED APPLICATIONS

The present application is a division of U.S. patent application Ser. No. 14/591,325, entitled "Anti-Reflection Layer For Back-Illuminated Sensor", filed on Jan. 7, 2015, and incorporated by reference herein, which claims priority to U.S. Provisional Patent Application 61/926,107, entitled "Anti-Reflection Layer For Back-Illuminated Sensor", filed on Jan. 10, 2014, and incorporated by reference herein.

The present application is related to U.S. patent application Ser. No. 12/476,190, entitled "Anti-Reflective Coating For Sensors Suitable For High Throughput Inspection Systems", filed by Brown on Jun. 1, 2009, now abandoned.

BACKGROUND OF THE DISCLOSURE

Field of the Disclosure

The present application relates to image sensors suitable for sensing radiation in deep UV (DUV) and vacuum UV (VUV) wavelengths, and to methods for making such image sensors. These sensors are suitable for use in photomask, reticle, or wafer inspection systems and for other applications.

Related Art

The integrated circuit industry requires inspection tools with increasingly higher resolution to resolve ever smaller features of integrated circuits, photomasks, reticles, solar cells, charge coupled devices etc., as well as detect defects whose sizes are of the order of, or smaller than, those feature sizes.

Inspection systems operating at short wavelengths, e.g. wavelengths shorter than about 250 nm, can provide such resolution in many cases. Specifically, for photomask or reticle inspection, it is desirable to inspect using a wavelength identical, or close, to the wavelength that will be used for lithography, i.e. close to 193.4 nm for current generation lithography and close to 13.5 nm for future EUV lithography, as the phase-shifts of the inspection light caused by the patterns will be identical or very similar to those caused during lithography. For inspecting semiconductor patterned wafers, inspection systems operating over a relatively broad range of wavelengths, such as a wavelength range that includes wavelengths in the near UV, DUV, and/or VUV ranges, can be advantageous because a broad range of wavelengths can reduce the sensitivity to small changes in layer thicknesses or pattern dimensions that can cause large changes in reflectivity at an individual wavelength.

In order to detect small defects or particles on photomasks, reticles, and semiconductor wafers, high signal-to-noise ratios are required. High photon flux densities are required to ensure high signal-to-noise ratios when inspecting at high speed because statistical fluctuations in the numbers of photons detected (Poisson noise) is a fundamental limit on the signal-to-noise ratio. In many cases, approximately 100,000 or more photons per pixel are needed. Because inspection systems are typically in use 24 hours per day with only short stoppages, the sensors are exposed to large doses of radiation after only a few months of operation.

A photon with a vacuum wavelength of 250 nm has energy of approximately 5 eV. The bandgap of silicon dioxide is about 10 eV. Although it would appear that such wavelength photons cannot be absorbed by silicon dioxide, silicon dioxide as grown on a silicon surface must have some dangling bonds at the interface with the silicon because the silicon dioxide structure cannot perfectly match that of the silicon crystal. Furthermore, because the single dioxide is amorphous, there are likely also some dangling bonds within the material. In practice, there will be a non-negligible density of defects and impurities within the oxide, as well as at the interface to underlying semiconductor, that can absorb photons with DUV wavelengths, particularly those shorter than about 250 nm in wavelength. Furthermore, under high radiation flux density, two high-energy photons may arrive near the same location within a very short time interval (nanoseconds or picoseconds), which can lead to electrons being excited to the conduction band of the silicon dioxide by two absorption events in rapid succession or by two-photon absorption.

A further requirement for sensors used for inspection, metrology and related applications is high sensitivity. As explained above, high signal-to-noise ratios are required. If the sensor does not convert a large fraction of the incident photons into signal, then a higher intensity light source would be required in order to maintain the same inspection or measurement speed compared with an inspection or metrology system with a more efficient sensor. A higher intensity light source would expose the instruments optics and the sample being inspected or measured to higher light intensities, possibly causing damage or degradation over time. A higher intensity light source would also be more expensive or, particularly at DUV and VUV wavelengths, may not be available. Silicon reflects a high percentage of DUV and VUV light incident on it. For example, near 193 nm in wavelength, silicon with a 2 nm oxide layer on its surface (such as a native oxide layer) reflects approximately 65% of the light incident on it. Growing an oxide layer of about 21 nm on the silicon surface reduces the reflectivity to close to 40% for wavelengths near 193 nm. A detector with 40% reflectivity is significantly more efficient than one with 65% reflectivity, but lower reflectivity, and hence higher efficiency, is desirable.

Anti-reflection coatings are commonly used on optical elements such as lenses and mirrors. However many coating materials and processes commonly used for optical elements are often not compatible with silicon-based sensors. For example, electron and ion-assisted deposition techniques are commonly used for optical coatings. Such coating processes cannot generally be used to coat semiconductor devices because the electrons or ions can deposit sufficient charge on the surface of the semiconductor device to cause electrical breakdown resulting in damage to the circuits fabricated on the semiconductor.

DUV and VUV wavelengths are strongly absorbed by silicon. Such wavelengths may be mostly absorbed within about 10 nm or a few tens of nm of the surface of the silicon. The efficiency of a sensor operating at DUV or VUV wavelengths depends on how large a fraction of the electrons created by the absorbed photons can be collected before the electrons recombine. Silicon dioxide can form a high quality interface with silicon with a low density of defects. Most other materials including many of those commonly used for anti-reflection coatings, if deposited directly on silicon, result in a very high density of electrical defects at the surface of silicon. A high density of electrical defects on the surface of silicon may not be an issue for a sensor intended to operate at visible wavelengths, as such wavelengths may typically travel about 100 nm or more into the silicon before being absorbed and may, therefore, be little affected by electrical defects on the silicon surface. However DUV and VUV wavelengths are absorbed so close to the silicon surface that electrical defects on the surface and/or trapped charged within the layer(s) on the surface can result in a significant fraction of the electrons created recombining at, or near, the silicon surface and being lost, resulting in a low efficiency sensor.

Therefore, a need arises for an image sensor capable of efficiently detecting high-energy photons yet overcoming the some or all of the above disadvantages.

SUMMARY OF THE DISCLOSURE

Methods of fabricating image sensors with high-quantum-efficiency for imaging DUV and/or VUV are described. Image sensors fabricated according to these methods are capable of long-life operation under high fluxes of DUV and VUV radiation. These methods include process steps to form light sensitive active and/or passive circuit elements in a layer on a semiconductor (preferably silicon) wafer.

An exemplary method of fabricating an image sensor includes forming an epitaxial layer on a substrate, forming a gate layer on the epitaxial layer, the gate layer comprising one or more layers of dielectric materials such as silicon dioxide and silicon nitride, forming circuit elements on the gate layer comprising poly-silicon and dielectric materials, but no metal films or metal interconnects, thinning the substrate to expose at least a portion of the epitaxial layer (the exposed epitaxial layer is referred to herein as a semiconductor membrane) and expose at least portions of the epitaxial layer, forming a pure boron layer directly on the exposed portions of the epitaxial layer, and forming one, or more, anti-reflection layers directly on the surface of the boron layer. As used herein, the phrase "circuit elements" refers to light sensitive devices such as charge-coupled devices and photodiodes, other semiconductor devices such as transistors, diodes, resistors and capacitors, and electrical interconnections (often called interconnects) between them. In this first exemplary embodiment, the circuit elements formed prior to boron deposition do not include any metal interconnects. These circuit elements are formed using standard semiconductor manufacturing processes including, but not limited to, photolithography, deposition, etching, ion implantation and annealing. Thinning the sample (e.g. a wafer) can be performed using chemical etching and/or polishing. Notably, this thinning can increase the sensitivity of the image sensor to light impinging the back surface. An anti-reflection coating is formed on the boron layer. This anti-reflection coating may comprise one or more layers of material. At least one of the layers may be deposited using an atomic layer deposition (ALD) technique. This anti-reflection coating increases the transmission of at least one wavelength of interest into the image sensor. In one embodiment, at least one exposed portion of the epitaxial layer can be doped after thinning the substrate and before forming the boron layer. After the boron and anti-reflection layers have been deposited on the back surface, the circuits on the front surface can be completed, including forming metal interconnects.

Another method of fabricating an image sensor includes forming an epitaxial layer on a substrate, then forming circuit elements on the epitaxial layer. This step may include forming metal interconnects. Either a handling wafer or a protective layer can be formed on the circuit elements. The substrate is then thinned to expose, at least part of, the epitaxial layer. As indicated above, this thinning can increase the sensitivity of the image sensor to light imping-ing on the back surface. A pure boron layer is formed on the surface of the epitaxial layer exposed in the thinning process. An anti-reflection coating is formed on the boron layer. This anti-reflection coating increases the transmission of at least one wavelength of interest into the image sensor. This anti-reflection coating may comprise one or more layers of material. At least one of the layers may be deposited using an atomic layer deposition (ALD) technique.

Image sensors with high-quantum-efficiency and long-life operation for DUV, and/or VUV radiation. These image sensors are thinned from the back-side so that they are highly sensitive to radiation impinging on the back-side of the image sensors (wherein these image sensors are back-illuminated). Deposited directly on the back surface of the epitaxial layer is a thin (e.g. between about 2 nm and about 20 nm thick) layer high-purity amorphous boron. In some embodiments, one or more additional layers of material may be coated on the boron. The thickness and material of each layer may be chosen to increase the transmission of a wavelength of interest into the image sensor.

The image sensors described herein may be fabricated using CCD (charge coupled device) or CMOS (complementary metal oxide semiconductor) technology. The image sensors may be two-dimensional area sensors, or one dimensional array sensors.

DETAILED DESCRIPTION OF THE DRAWINGS

Figure 1:
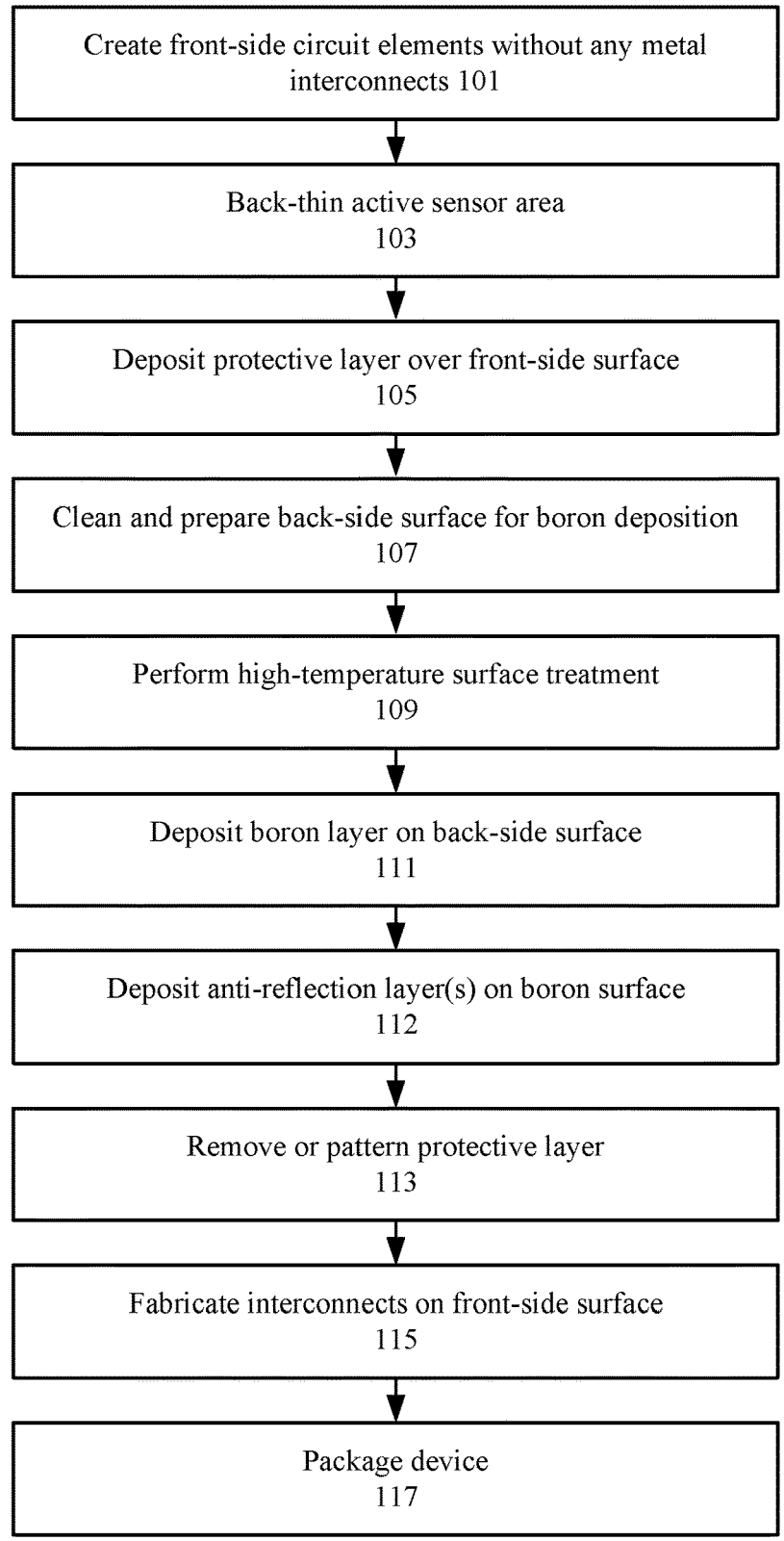
FIG. 1 illustrates an exemplary method of fabricating an image sensor.

FIG. 1 illustrates an exemplary technique 100 for fabricating an image sensor. In step 101, circuit elements can be created using standard semiconductor processing steps, such as lithography, deposition, ion implantation, annealing, and etching. CCD and/or CMOS sensor elements and devices may also be created during step 101. These circuit elements are created in an epitaxial layer on the front surface of the wafer and therefore are also called front-side circuit elements. In preferred embodiments, the epitaxial (epi) layer is about 10 μm to 40 μm thick. In preferred embodiments, both the epi layer and the substrate are doped with p-type dopants (such as boron), but the epi layer has a much lower dopant concentration (referred to below and in the figures as p−doping) than the bulk wafer (referred to below and in the figures as p+ doping). Typically the epitaxial layer resistivity will be about 10 to 100 Ωcm, and the substrate resistivity will be less than about 0.01 Ωcm. Although poly-silicon interconnects may be formed in step 101, metal interconnects are generally not formed in this step because metals will be damaged in subsequent high-temperature processing steps.

In step 103, the active sensor areas or even the whole wafer may be thinned from the backside. This thinning typically includes a combination of polishing and etching to expose the epi layer. In one embodiment, the wafer is polished from the backside until the wafer is about 200 μm to 300 μm thick. Then, the front surface and the frame areas around the active sensor areas are protected with a material, such as photoresist or other suitable material. At this point, a chemical etchant is used to etch away the bulk wafer over the active sensor area, thereby exposing the active sensor area. Because the bulk wafer has a much higher dopant concentration and defect density than the epi layer, the etch rate of the bulk semiconductor material is much higher than that of the epi layer. The etch process slows down when it reaches the epi layer, thereby resulting in a uniform thickness membrane area. In another embodiment, the image sensor wafer is bonded to a handle wafer, which might be made of quartz, silicon, sapphire or other material. Then, a polishing process is used to polish the whole wafer until only the epi layer remains.

In step 105, a protective layer can be deposited on the front-side surface to protect the front-side circuit elements during steps 107-111. In particular, any exposed silicon or poly-silicon on the front-side surface must be protected as boron tends to preferentially deposit on silicon. In some embodiments, step 105 may be performed prior to step 103 so that the protective layer can provide additional protection for the front-side surface during the back-thinning process (step 103). In some embodiments, the protective layer may comprise a silicon nitride layer deposited, e.g., using plasma-enhanced CVD deposition.

In step 107, the back-side surface can be cleaned and prepared for boron deposition. During this cleaning, native oxide and any contaminants, including organics and metals, should be removed from the back-side surface. In one preferred embodiment, the cleaning can be performed using a dilute HF solution or an RCA clean process (which is a well-known set of wafer cleaning steps including the removal of organic contaminants, the thin oxide layer, and ionic contamination). After cleaning and during preparation, the wafer is preferably dried using the Marangoni drying technique (surface tension based drying technology) or a similar technique to leave the surface dry and free of water marks. In preferred embodiments, the wafer is protected in a controlled atmosphere during steps 107-109 (using, e.g. dry nitrogen) to minimize native oxide regrowth.

In step 109, the wafer can be held at a high-temperature for a few minutes in a reducing environment, such as a dilute hydrogen gas or a low-pressure hydrogen gas. In preferred embodiments, the wafer can be held at a temperature of approximately 800° C. to 850° C. for about 1 to 4 minutes. This high temperature can remove any native oxide layer that might have regrown following step 107.

In step 111, an amorphous layer of pure boron is deposited on the back-side of the back-side surface. In one preferred embodiment, this deposition can be performed using a mixture of diborane and hydrogen gases at a temperature of about 650-800° C. to create a high-purity amorphous boron layer. The thickness of the boron layer depends on the intended application for the sensor. Typically, the boron layer thickness is between about 2 nm and 20 nm. Preferably the boron layer thickness is between about 3 nm and 10 nm. The minimum thickness is generally limited by the need for a pinhole-free uniform film. The maximum thickness generally depends on the absorption of the wavelengths of interest by the boron. Note that steps 109 and 111 can be performed in the same process tool and, preferably, in the same process chamber, thereby ensuring that steps 109 and 111 can be performed in quick succession with no possibility of surface contamination or oxide growth between the steps. More details on boron deposition can be found in "Chemical vapor deposition of α-boron layers on silicon for controlled nanometer-deep $p^+$-n junction formation," Sarubbi et al., J. Electron. Material, vol. 39, pp. 162-173, 2010, which is incorporated by reference herein.

The purity and lack of pinholes in the boron layer are critical to the sensitivity and lifetime of the image sensors disclosed herein. If any native oxide film is not removed from the epi layer surface before deposition of the boron, then that native oxide will be affected by DUV, VUV or other high energy photons and can cause a degradation of sensor performance with use. Even if all the native oxide is removed prior to the boron deposition, if there are pinholes in the boron layer, then, after processing, oxygen will be able to reach the epi layer through those pinholes and may oxidize the surface of that layer.

In step 112, other layers are deposited on top of the boron layer during, or immediately following, step 111. These other layers may include anti-reflection coatings comprised of one or more materials, such as silicon dioxide, silicon nitride, aluminum oxide, hafnium dioxide, magnesium fluoride, and lithium fluoride. One or more of these other layers may be deposited using ALD. An advantage of using an ALD process for depositing anti-reflection layers is that ALD processes typically allow very precise (single monolayer) control of the thickness of the deposited layer(s). Anti-reflection layers for short wavelengths, such as DUV and VUV wavelengths, are preferably thin (such as between about 10 nm and 20 nm thick). Control of the layer thickness to one or two atomic layers (a few tenths of a nm) has the advantage of maintaining consistent reflectivity (and hence sensitivity) from sensor to sensor. Even though the anti-reflection coating may be affected by DUV, VUV or other radiation, the presence of the boron layer between the anti-reflection coating and the epi layer shields the epi layer from charges and traps in the anti-reflection coating and ensures that the sensitivity of the image sensor does not significantly degrade. In an alternative embodiment, step 112 may be performed between steps 115 and 117. When all the process steps involved depositing the anti-reflection coating use temperatures less than about 450° C., it is possible to deposit the anti-reflection coating onto wafers or sensors that have metal interconnects already formed on them. Another advantage of using ALD for depositing the layer or layers that comprise the anti-reflection coating is that ALD processes normally involve temperatures much less than 450° C.

In step 113, the front-side protective layer can be removed or patterned to prepare for fabrication of interconnects on the front surface. In some embodiments, this removal/patterning may include etching of the front-side surface in dilute HF, because the boron layer is relatively impervious to dilute HF.

In step 115, interconnects on the front surface can be patterned and fabricated. These interconnects may be formed by Al, Cu, or another metal. After interconnect fabrication is complete, a passivation layer may be deposited on the front-side surface to protect these interconnects.

In step 117, the completed circuit elements can be packaged. The package may include flip-chip bonding or wire bonding of a chip to a substrate. The package may include a window that transmits wavelengths of interest, or may comprise a flange or seal for interface to a vacuum seal.

Figure 2:
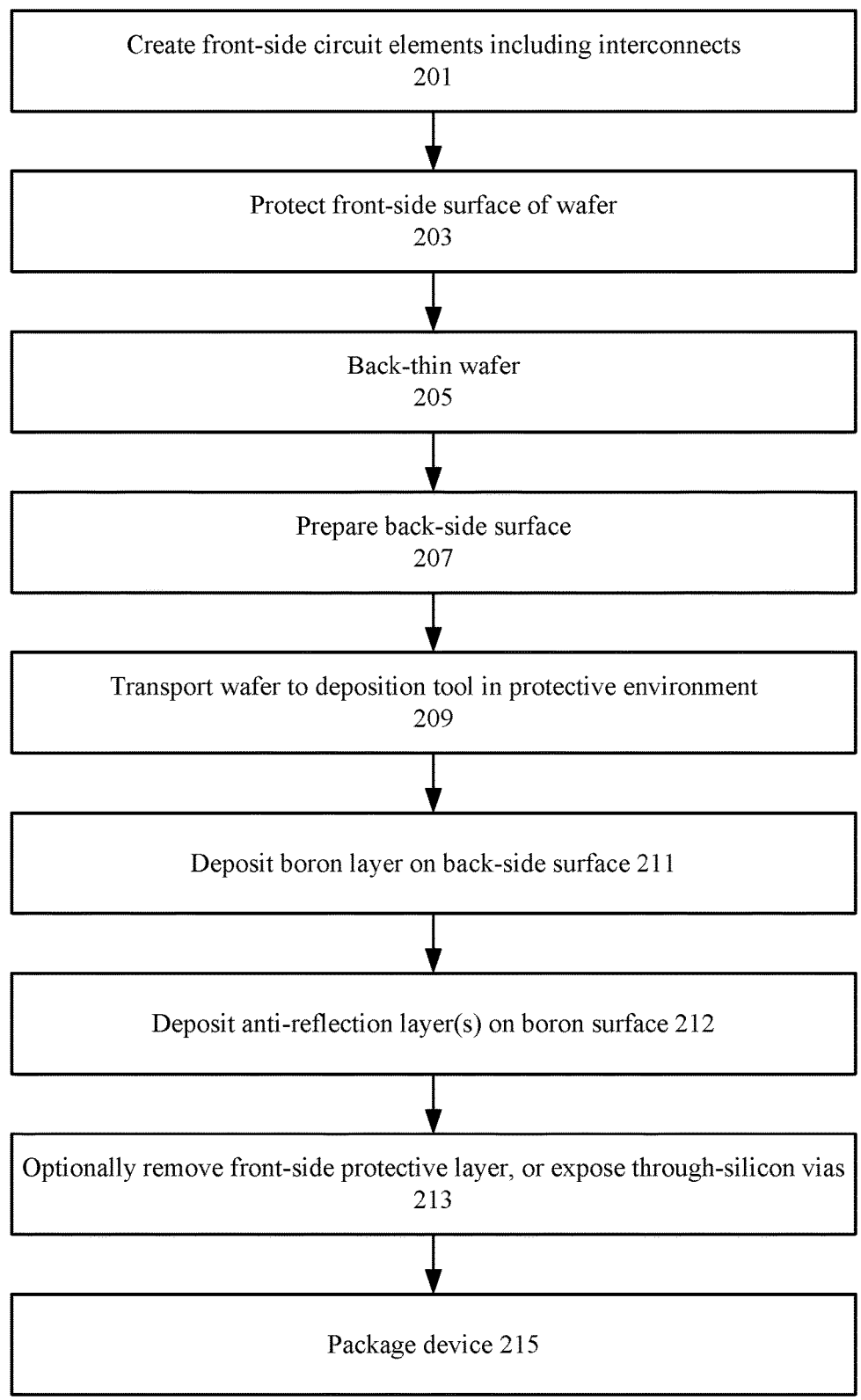
FIG. 2 illustrates an alternative exemplary technique for fabricating an image sensor.

FIG. 2 illustrates an alternative exemplary technique 200 for fabricating an image sensor. In this embodiment, the circuit elements can be created in step 201 using standard semiconductor processing steps including lithography, deposition, ion implantation, annealing, and etching. In one embodiment, CCD and/or CMOS sensor elements and devices may also be created in step 201. These circuit elements are created in an epi layer on the front-side surface of the wafer. In preferred embodiments, the epi layer is about 10 μm to 40 μm thick. The epi layer has a low dopant concentration (p−). In one embodiment, interconnects, such as metal interconnects, can also be created in step 201.

In step 203, the front-side surface of the wafer can be protected. This protection may include depositing one or more protective layers on top of the circuit elements formed during step 201. This protection may also, or instead, include attaching the wafer to a handling wafer, such as a silicon wafer, a quartz wafer, or a wafer made of other material.

Step 205 involves thinning the wafer from the back-side so as to expose the epitaxial layer in, at least, the active sensor areas. This step may involve polishing, etching, or both. In some embodiments, the entire wafer is back-thinned. In other embodiments, only the active sensor areas are thinned all the way to the epitaxial layer.

Step 207 includes cleaning and preparing the back-side surface prior to the boron deposition. During this cleaning, the native oxide and any contaminants, including organics and metals, should be removed from the back-side surface. In one embodiment, this cleaning can be performed using a dilute HF solution or using an RCA clean process. After cleaning and during preparation, the wafer can be dried using the Marangoni drying technique or a similar technique to leave the surface dry and free of water marks.

In step 209, the wafer can be transported to a deposition tool in a protective environment, thereby allowing the wafer to be protected during step 211. In one embodiment, for example, the protective environment is a dry nitrogen atmosphere, which minimizes native oxide regrowth. The time spent to perform step 209 should be kept to a minimum, preferably no more than about five minutes.

In step 211, boron is deposited on the back-side surface of the wafer. In one preferred embodiment, this deposition can be done using a mixture of diborane and hydrogen gases at a temperature of about 400-450° C., thereby creating a high-purity amorphous boron layer. The thickness of the deposited boron layer depends on the intended application for the sensor. Typically, the boron layer thickness will be between about 3 nm and 10 nm. The minimum thickness is set by the need for a pinhole-free uniform film, whereas the maximum thickness depends on the absorption of the photons or charged particles of interest by the boron, as well as the maximum length of time that the wafer can be kept at the elevated temperature when there are metal interconnects on the front-side.

In step 212, other layers may be deposited on the boron layer. These other layers include anti-reflection coatings comprised of one or more materials such as silicon dioxide, silicon nitride, aluminum oxide, hafnium dioxide, magnesium fluoride and lithium fluoride. One or more of these other layers may be deposited using an ALD process. As explained above, one advantage of using an ALD process for depositing an anti-reflection layer for DUV or VUV wavelength is the very precise layer thickness control that is possible. Furthermore, in the embodiment illustrated in FIG. 2, because metal interconnects are present, it is preferred that the deposition processes not use temperatures greater than 450° C. Another advantage of using ALD for the deposition is that most ALD processes use temperatures much lower than 450° C.

In one embodiment, the protective front-side layer may be removed in step 213. In another embodiment, in step 213, holes or vias can be opened in the protective front-side layer or through-silicon vias around the edges of the device can be exposed, thereby allowing connection to the circuit structures.

In step 215, the resulting structure may be packed in a suitable package. The packing step may comprise flip-chip bonding or wire bonding of the device to the substrate. The package may include a window that transmits wavelengths of interest, or may comprise a flange or seal for interface to a vacuum seal.

Figure 3A:
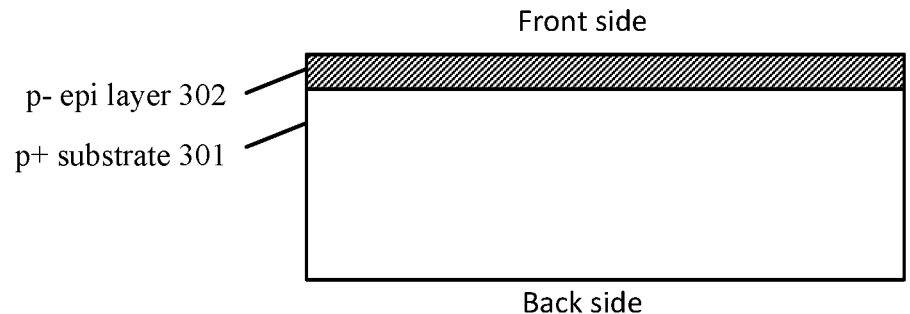
FIGS. 3A-3G illustrate exemplary cross-sections of a wafer subjected to the method described in reference to FIG. 1.
Figure 3B:
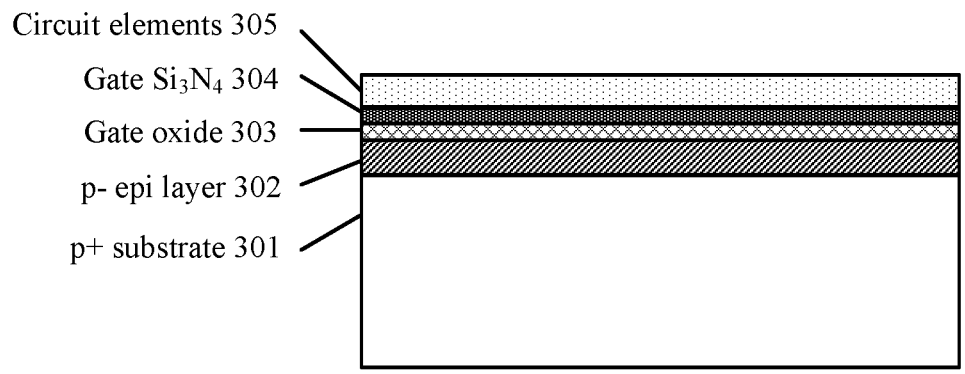
Figure 3C:
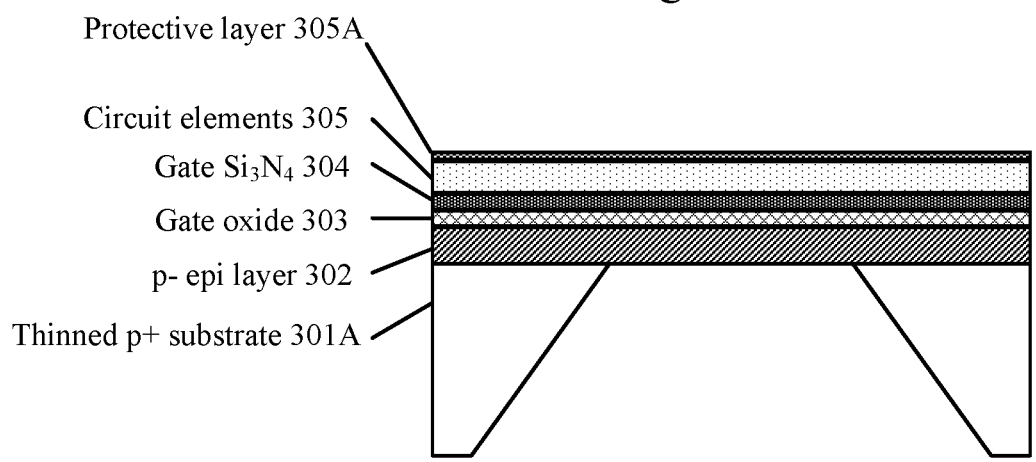
Figure 3D:
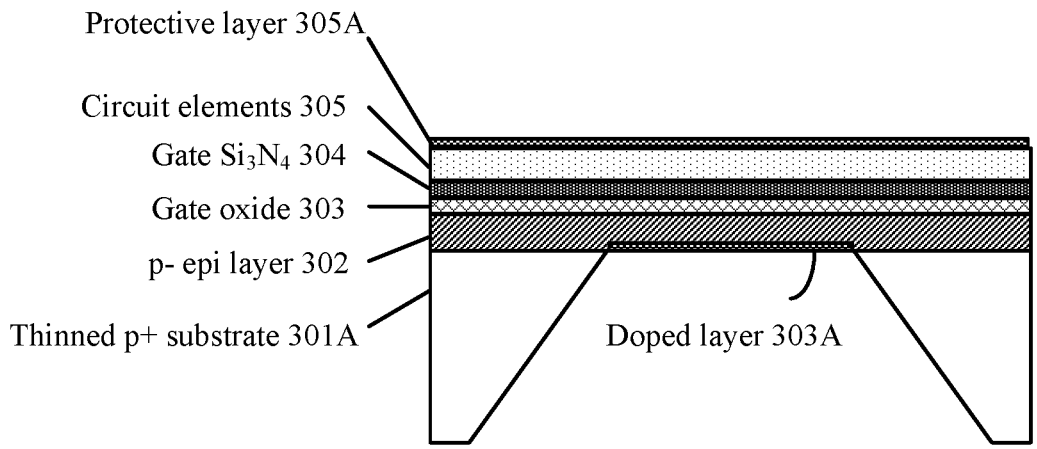
Figure 3E:
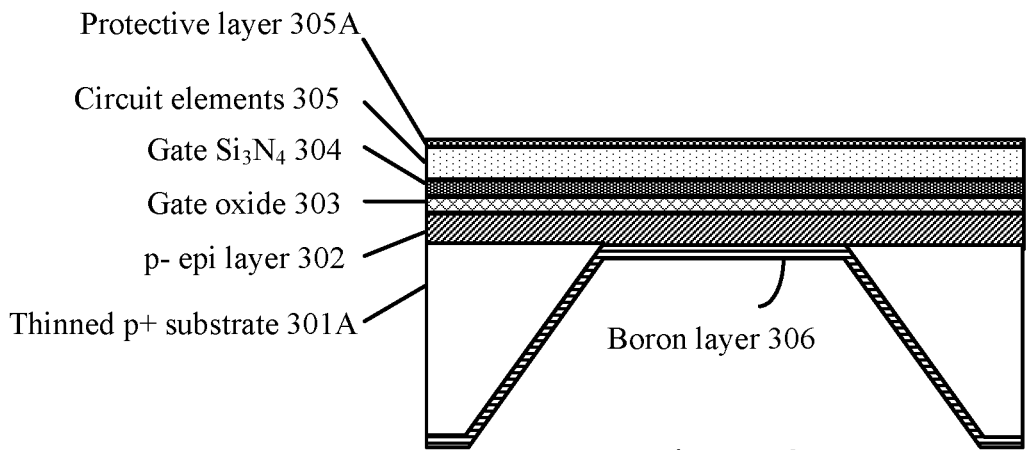
Figure 3F:
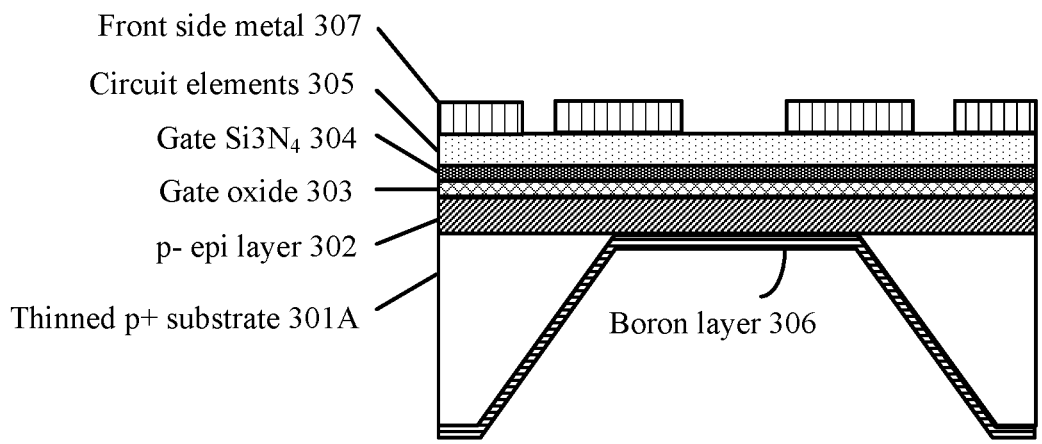
Figure 3G:
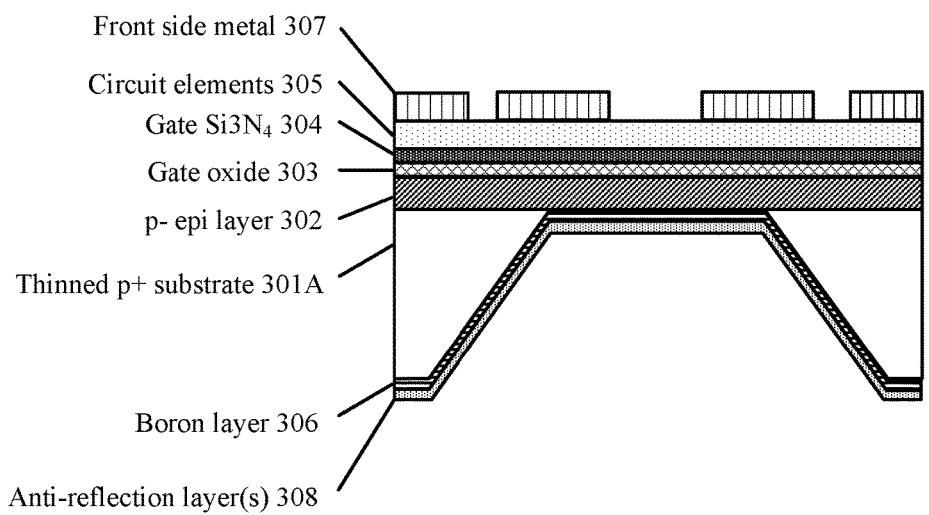

FIGS. 3A-3F illustrate exemplary cross-sections of a wafer subjected to method 100 (FIG. 1). FIG. 3A illustrates an epitaxial (epi) layer 302 being formed on the front side of a substrate 301. In one embodiment, substrate 301 is a p+ (i.e. highly p doped) substrate, and epi layer 302 is a p− epi layer (i.e., a layer with a low concentration of p dopant). FIG. 3B illustrates a gate oxide layer 303 being formed on epi layer 302, a silicon nitride ($Si_3N_4$) gate layer 304 being formed on gate oxide layer 303, and front-side circuit elements 305 being formed on gate layer 304 (step 101). Note that depending on the type of image sensor technology, the gate dielectric may comprise one, two, or three layers. Forming the front-side circuit elements includes implanting or doping portions of the front side of the epi layer and may involve patterning the gate layer. FIG. 3C illustrates substrate 301 being thinned at its back-side surface, at least in certain areas, to form thinned substrate 301A, which in combination with epi layer 302 forms a semiconductor membrane (step 103), and a protective layer 305A being formed on front-side circuit elements 305 (step 105). FIG. 3D illustrates an optional doped layer 303A that may be formed in a portion of epi layer 302 exposed by thinned substrate 301A. This doping may be formed by ion-implantation followed by thermal activation, by plasma doping, by plasma assisted doping or similar techniques. In one embodiment, this doping can be performed during step 107 as part of the back-side surface preparation and before high-temperature surface treatment in step 109. FIG. 3E illustrates a pure boron layer 306 being formed on thinned substrate 301A and exposed epi layer 302 (step 111). Since some of the boron diffuses a few nm into the epi layer, some embodiments do not need to include the separately doped layer 303A. FIG. 3F illustrates that after protective layer 305A is removed or opened (step 113), front-side metal (i.e. interconnect) 307 can be formed on front-side circuit elements 305. FIG. 3G illustrates forming one or more anti-reflection layers 308 on boron layer 306. Anti-reflection layers 308 can be formed any time after step 111 (depositing the boron layer), but before step 117 (packaging). At least of the anti-reflection layers is deposited using an ALD process. As explained above, advantages of using an ALD process for depositing DUV and VUV anti-reflection layers include precise thickness control and low processing temperature (usually much lower than 450° C.)

Figure 4A:
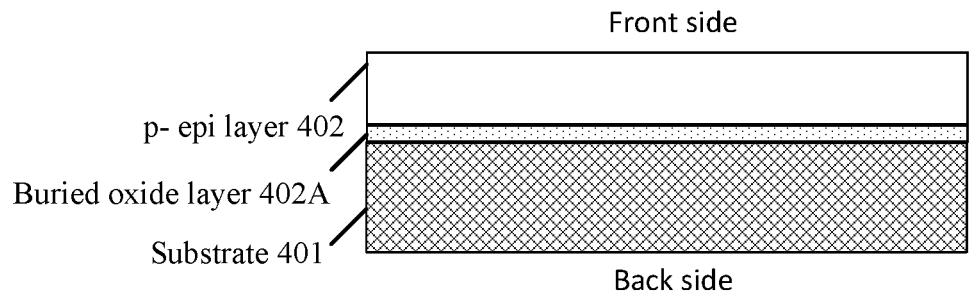
FIGS. 4A-4H illustrate exemplary cross-sections of a wafer subjected to the method described in reference to FIG. 2.
Figure 4B:
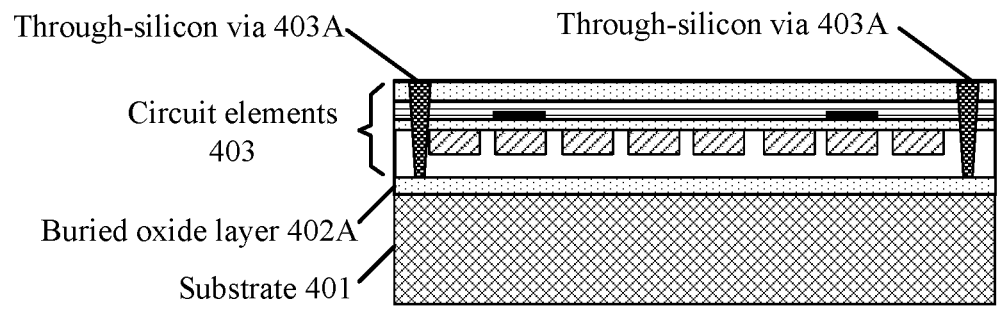
Figure 4C:
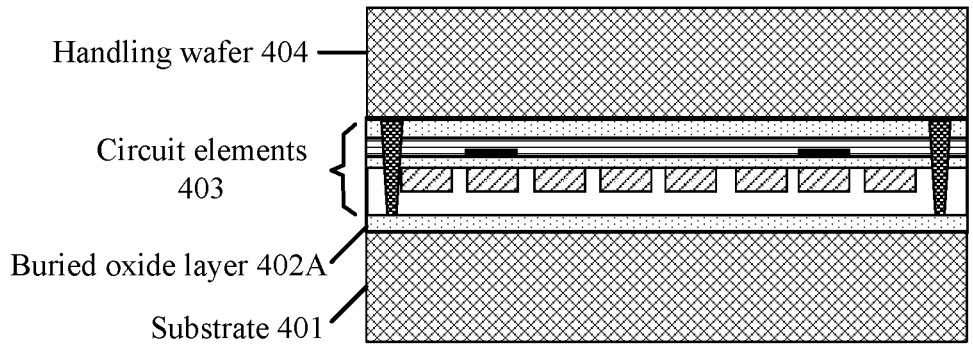
Figure 4D:
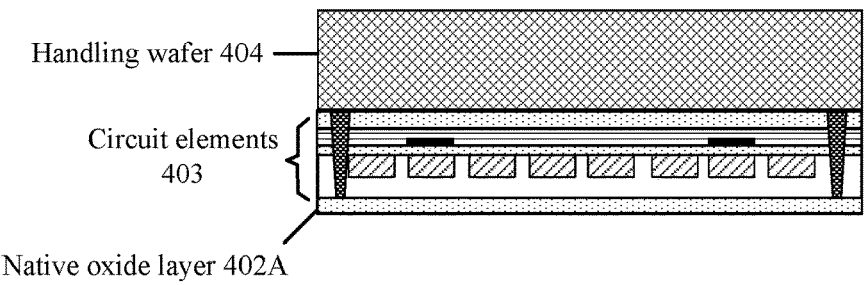
Figure 4E:
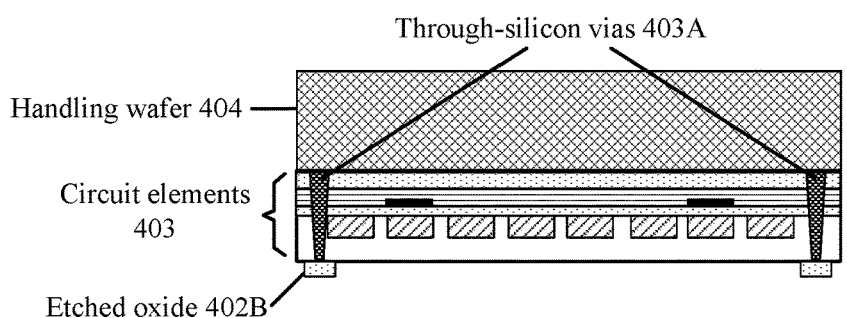
Figure 4F:
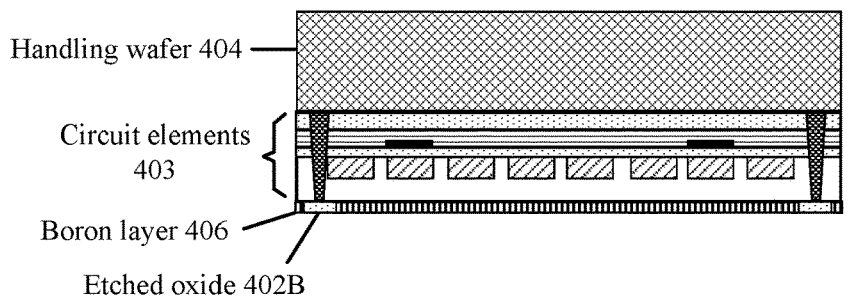
Figure 4G:
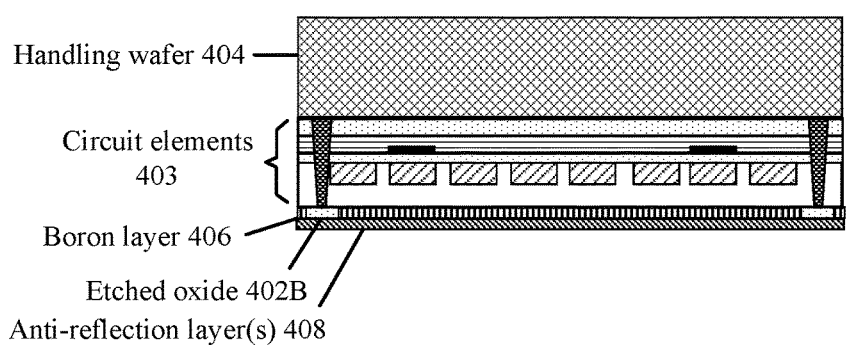
Figure 4H:
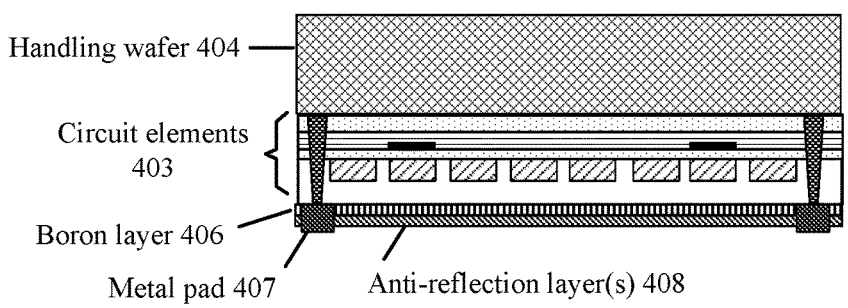

FIGS. 4A-4G illustrate exemplary cross-sections of a wafer subjected to method 200 (FIG. 2). FIG. 4A illustrates an epitaxial (epi) layer 402 being formed on the front side of a substrate 401. In one embodiment, substrate 401 is a p+ substrate, and epi layer 402 is a p− epi layer. In one embodiment, the substrate is an SOI (silicon-on-insulator) wafer with a buried oxide layer 402A between substrate 401 and epi layer 402. SOI wafers are commercially available from Soitec (Bernin, France) and other suppliers. In other embodiments, the epi layer is grown directly on the substrate 401 without any buried oxide layer 402A. FIG. 4B illustrates various circuit elements 403 including interconnects that can be formed on the epi layer (step 201) (note that the epi layer is shown, but not labeled so as not to overly complicate the drawings). Because the interconnects are formed on the wafer prior to back thinning all the way to the epi layer, these interconnects can be formed using normal sub-micron CMOS processing techniques and may include multiple layers of high density metal interconnects. In some embodiments, multiple through-silicon vias (TSV) 403A are created around one, or more, edges of the image sensor array in order to allow connection to the circuit elements 403. FIG. 4C illustrates a handling wafer 404 attached to the top of the circuit elements 403 (step 203). Note that the through-silicon vias are shown, but not labeled so as not to overly complicate the drawings. In other embodiments, a protective layer can be used instead of handling wafer 404. FIG. 4D illustrates the wafer after substrate 401 is back-thinned to the epi layer on which circuit elements 403 are formed, which in this case forms the semiconductor membrane. In one embodiment, this back-thinning exposes buried oxide layer 402A. FIG. 4E illustrates the wafer after a cleaning and preparation of the back-side surface (step 207), which may result in etched oxide 402B being patterned so as to protect TSVs 403A while exposing the epi layer in the image sensor array areas. FIG. 4F illustrates a pure boron layer 406 after being formed on the back-side surface of the epi layer 402 (step 211). FIG. 4G illustrates one or more anti-reflection layers 408 deposited on top of the pure boron layer 406. At least one of the anti-reflection layers is deposited using an ALD process. As explained above, advantages of ALD include the low processing temperature and precise control of the thickness(es) of material deposited. FIG. 4H illustrates the wafer after etched oxide 402B and any overlying anti-reflection layers are removed and replaced with metal pad 407 so as to allow electrical connection to the TSV 403A (step 213).

In any of the above described embodiments, the anti-reflection layer(s) may have a thickness (or thicknesses) chosen so as to maximize the transmission of the wavelength(s) of interest into the silicon sensor. When the absorption of the anti-reflection layers is not significant, then maximum transmission into the silicon corresponds to minimum reflectivity. For example, for a sensor intended to operate near 193 nm in wavelength, the thickness(es) of the anti-reflection layer(s) may be chosen so as to maximize transmission of wavelengths near 193 nm. For DUV wavelengths amorphous alumina (aluminum oxide) can form an effective anti-reflection coating for thin (<10 nm) boron layers on silicon. Alumina is suitable for deposition by ALD. An alumina coating thickness of approximately 16.5 nm on a thin boron layer (such as a 2 to 3 nm thick boron layer) results in a reflectivity minimum less than 10% close to 193 nm in wavelength for near normal incidence. Because a thin alumina layer has negligible absorption near 193 nm in wavelength, this reflectivity minimum corresponds to maximum transmission into the sensor. One advantage of an ALD process for depositing this kind of anti-reflection layer over other deposition techniques is that ALD processes generally do not need high energy ions or electrons for the deposition and so pose less risk for damaging sensitive semiconductor circuits. Another advantage is that very precise thickness control (approximately one monolayer) is possible with ALD processes. Since anti-reflection layers for DUV and VUV wavelengths need to be thin (such as 16.5 nm in the above example), precise thickness control results in better consistency from one sensor to another and across the whole light sensitive area of a sensor.

In some embodiments, the anti-reflection coating may comprise more than one layer. Particularly when the sensor is desired to operate over a range of wavelengths, or when available coating materials individually do not give as low a reflectivity as desired, a multi-layer anti-reflection coating may give better performance than a single layer coating. For example, if a silicon nitride coating is used instead of an alumina coating for a wavelength near 193 nm, a single layer coating of 9 nm will give a reflectivity minimum near 193 nm with about 0.8% reflectance. However, because silicon nitride absorbs DUV light, the fraction of 193 nm light transmitted into the silicon will actually be less for the 9 nm nitride coating than for the 16.5 nm alumina coating (about 53% compared with about 58%). Reducing the silicon nitride coating thickness to about 8 nm can improve the transmission into the silicon by about 0.5%, even though the reflectivity is little higher than for the 9 nm coating (about 1.5% versus about 0.8%). A two-layer coating comprising an approximately 17 nm magnesium fluoride layer on top of an approximately 5 nm silicon nitride layer on 2-3 nm of boron on the silicon sensor can improve the transmission of 193 nm light into the silicon to about 56%, which is close to the approximately 58% achievable with a single-layer alumina coating. This is just one example of how additional coating layers can allow less-than-ideal materials to make significant improvements in the transmission of the wavelength of interest into a sensor. Because both layers are thin, ALD processes can advantageously be used to deposit both layers in order to precisely control the thicknesses.

The above examples are not meant to limit the scope of the invention disclosed herein. They are meant merely as illustrations of how appropriate anti-reflection coatings can be chosen for a wavelength or wavelengths of interest using available materials. The refractive indices of most materials are not accurately known for DUV wavelengths, and the refractive indices of a material may be different for different deposition conditions, as, for example, the density of the material may change with changes in deposition conditions. The optimal anti-reflection coating layer thickness for the above examples may differ from the above values due to the actual refractive indices of the materials differing from the values assumed for the calculations. It is well understood how to calculate the reflectance and absorption of thin films. One of appropriate skill can calculate appropriate coating thicknesses for a given wavelength or wavelengths once the refractive indices of the materials at those wavelengths are known.

Magnesium fluoride and calcium fluoride are particularly useful materials for VUV and DUV wavelengths because they do not strongly absorb wavelengths longer than about 115 nm and 125 nm respectively. Alumina is also useful for DUV and some VUV wavelengths. $SiO_2$ can be useful for wavelengths longer than about 130 nm. Silicon nitride and hafnium dioxide are examples of higher index materials that can be useful at the longer wavelength end of the DUV spectrum, where their absorption is weaker, but are not so useful at VUV wavelengths because of relatively strong absorption at such wavelengths.

Figure 5:
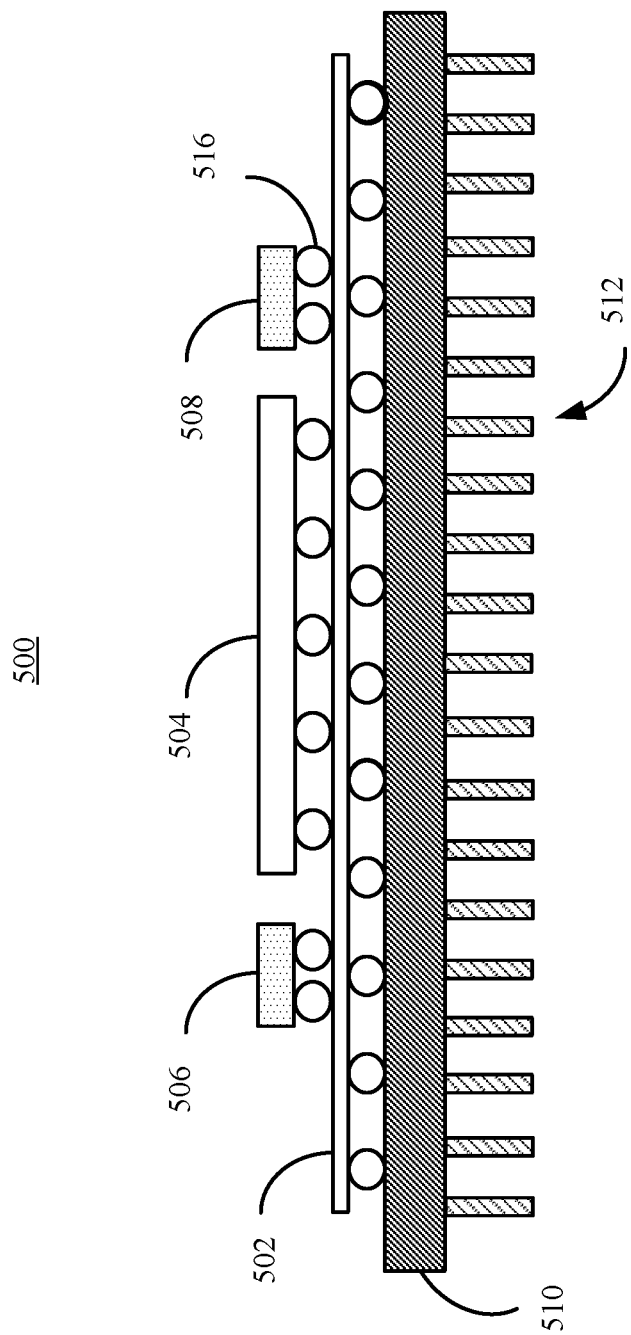
FIG. 5 illustrates an exemplary detector assembly incorporating an image sensor, a silicon interposer, and other electronics.

FIG. 5 illustrates an exemplary detector assembly 500 incorporating an image sensor 504, a silicon interposer 502 and other electronics in accordance with certain embodiments of the present invention.

In one aspect of the present invention, the detector assembly 500 may include one or more light sensitive sensors 504 disposed on the surface of an interposer 502. In some embodiments, the one or more interposers 502 of the assembly 500 may include, but are not limited to, a silicon interposer. In a further aspect of the present invention, the one or more light sensitive sensors 504 of the assembly 500 are back-thinned and further configured for back-illumination including a boron layer and one, or more, anti-reflection layers deposited on the back surface as described above.

In another aspect of the present invention, various circuit elements of the assembly 500 may be disposed on or built into the interposer 502. In one embodiment, one or more amplification circuits (e.g., charge conversion amplifier) (not shown) may be disposed on or built into the interposer 502. In another embodiment, one or more conversion circuits 508 (e.g., analog-to-digital conversion circuits, i.e. digitizers 508) may be disposed on or built into the interposer 502. In another embodiment, one or more driver circuits 506 may be disposed on or built into the interposer 502. For example, the one or more driver circuits 506 may include a timing/serial drive circuit. For instance, the one or more driver circuits 506 may include, but are not limited to, clock driver circuitry or reset driver circuitry. In another embodiment, one or more decoupling capacitors (not shown) may be disposed on or built into the interposer 502. In a further embodiment, one or more serial transmitters (not shown in FIG. 5) maybe disposed on or built into the interposer 502.

In another aspect of the present invention, one or more support structures may be disposed between the bottom surface of the light sensitive array sensor 504 and the top surface of the interposer 502 in order to provide physical support to the sensor 504. In one embodiment, a plurality of solder balls 516 may be disposed between the bottom surface of the light sensitive array sensor 504 and the top surface of the interposer 502 in order to provide physical support to the sensor 504. It is recognized herein that while the imaging region of the sensor 504 might not include external electrical connections, the back-thinning of the sensor 504 causes the sensor 504 to become increasingly flexible. As such, solder balls 516 may be utilized to connect the sensor 504 to the interposer 502 in a manner that reinforces the imaging portion of the sensor 504. In an alternative embodiment, an underfill material may be disposed between the bottom surface of the light sensitive array sensor 504 and the top surface of the interposer 502 in order to provide physical support to the sensor 504. For example, an epoxy resin may be disposed between the bottom surface of the light sensitive array sensor 504 and the top surface of the interposer 502.

In another aspect of the present invention, the interposer 502 and the various additional circuitry (e.g., amplification circuit, driver circuits 506, digitizer circuits 508, and the like) are disposed on a surface of a substrate 510. In a further aspect, the substrate 510 includes a substrate having high thermal conductivity (e.g., ceramic substrate). In this regard, the substrate 510 is configured to provide physical support to the sensor 504/interposer 502 assembly, while also providing a means for the assembly 500 to efficiently conduct heat away from the imaging sensor 504 and the various other circuitry (e.g., digitizer 506, driver circuitry 508, amplifier, and the like). It is recognized herein that the substrate may include any rigid highly heat conductive substrate material known in the art. For example, the substrate 510 may include, but is not limited to, a ceramic substrate. For instance, the substrate 510 may include, but is not limited to, aluminum nitride.

In another embodiment, the substrate 510 may be configured to provide an interface to a socket or an underlying printed circuit board (PCB). For example, as shown in FIG. 5, the substrate 510 may provide interconnection between the interposer 502 and a socket or a PCB via interconnects 512. Those skilled in the art will recognize that the substrate 510 may be operatively coupled to an underlying PCB and further electrically coupled to a socket or PCB in a variety of ways, all of which are interpreted to be within the scope of the present invention.

The various embodiments of the structures and methods of this invention that are described above are illustrative only of the principles of this invention and are not intended to limit the scope of the invention to the particular embodiments described. For example, additional steps may be added to the flow charts depicted in FIGS. 1 and 2, or some of the steps shown may be done in different sequence than shown. Thus, the invention is limited only by the following claims and their equivalents.

The invention claimed is:

1. A method of fabricating an image sensor, the method comprising:
   forming an epitaxial layer on a substrate;
   forming a gate layer on the substrate;
   forming a circuit element layer on the gate layer;
   thinning the substrate to generated a thinned substrate, the thinned substrate exposing at least portions of the epitaxial layer;
   doping at least one exposed portion of the epitaxial layer;
   forming a pure boron layer on the exposed portions of the epitaxial layer; and
   forming an anti-reflection coating on the surface of the pure boron layer, wherein forming the anti-reflection coating includes an atomic-layer deposition (ALD) process.

2. The method of claim 1, wherein forming the anti-reflection coating comprises forming at least two layers of different materials.

3. The method of claim 1, wherein forming the anti-reflection coating comprises forming alumina.

4. The method of claim 3, wherein forming the alumina comprises depositing a substantially pure alumina layer having a thickness of approximately 16.5 nm.

5. The method of claim 1, wherein forming the pure boron layer comprises depositing boron such that the pure boron layer has a thickness in the range of 2 nm to 10 nm.

6. A method of fabricating an image sensor, the method comprising:
   forming an epitaxial layer on a substrate;
   forming a gate layer on the substrate;
   forming a circuit element layer on the gate layer;
   thinning the substrate to generated a thinned substrate, the thinned substrate exposing at least portions of the epitaxial layer;
   doping at least one exposed portion of the epitaxial layer;
   forming a pure boron layer on the exposed portions of the epitaxial layer; and
   forming an anti-reflection coating consisting essentially of alumina on the surface of the pure boron layer.

7. The method of claim 6, wherein forming the anti-reflection coating comprises depositing a substantially pure alumina layer having a thickness of approximately 16.5 nm.

8. The method of claim 6, wherein forming the anti-reflection coating comprises depositing the substantially pure alumina layer using an atomic-layer deposition (ALD) process.

9. The method of claim 6, wherein forming the pure boron layer comprises depositing boron such that the pure boron layer has a thickness in the range of 2 nm to 10 nm.

* * * * *